United States Patent [19]

Wen et al.

[11] Patent Number: 5,553,395
[45] Date of Patent: Sep. 10, 1996

[54] BUBBLER FOR SOLID METAL ORGANIC SOURCE MATERIAL AND METHOD OF PRODUCING SATURATED CARRYING GAS

[75] Inventors: Cheng P. Wen, Mission Viejo; Randy K. Rolph, Palos Verdes Estates; Timothy T. Zielinski, Torrance, all of Calif.

[73] Assignee: Hughes Aircraft Company, Los Angeles, Calif.

[21] Appl. No.: 455,879

[22] Filed: May 31, 1995

[51] Int. Cl.$^6$ ............................... F26B 3/08; F26B 17/00
[52] U.S. Cl. ............................... 34/359; 34/363; 34/576; 34/582; 118/726
[58] Field of Search ............................... 34/359, 360, 363, 34/375, 576, 578, 582, 586, 443; 118/715, 726; 427/248.1, 250; 266/251

[56] References Cited

U.S. PATENT DOCUMENTS

| | | | |
|---|---|---|---|
| 4,101,263 | 7/1978 | Lumpkin, Jr. | 34/363 X |
| 5,243,767 | 9/1993 | Stein | 34/359 |
| 5,377,429 | 1/1995 | Sandhu et al. | 34/586 |
| 5,381,605 | 1/1995 | Krafft | 34/408 |
| 5,489,166 | 2/1996 | Schmit | 34/360 X |

*Primary Examiner*—John M. Sollecito
*Assistant Examiner*—Steve Gravini
*Attorney, Agent, or Firm*—M. E. Lachman; M. W. Sales; W. K. Denson-Low

[57] ABSTRACT

A cone-shaped bubbler for use with solid metal organic source material used in metal organic chemical vapor phase deposition systems, and a method of producing carrying gas saturated with source material that is injected into such systems. The bubbler comprises a sealed container having a slanted wall with an inverted cone-shaped cross section. Solid metal organic source material is disposed in the container. A heat bath surrounds the sealed container. A carrying gas inlet is disposed adjacent the top of the container. Carrying gas is injected in a tangential direction relative to the source material, and a whirlpool effect is generated by the tangential gas flow that imparts a centrifugal force to gas molecules, pushing the source material against the wall to promote heat flow from the heat bath to sustain high rate sublimation. A gas outlet is disposed adjacent the bottom of the container. Once source material lining the slanted inner wall is removed, gravitational forces cause source material to refill the empty space, reducing channel formation and preventing thermal isolation of the source material at the center of the bubbler. The method comprises providing a sealed container with a slanted wall having an inverted cone-shaped cross section, disposing solid metal organic source material in the container, heating the sealed container, injecting a carrying gas adjacent the top of the container so that carrying gas is injected in a tangential direction relative to the solid source material, and removing saturated carrying gas from a gas outlet disposed adjacent the bottom of the container.

8 Claims, 2 Drawing Sheets

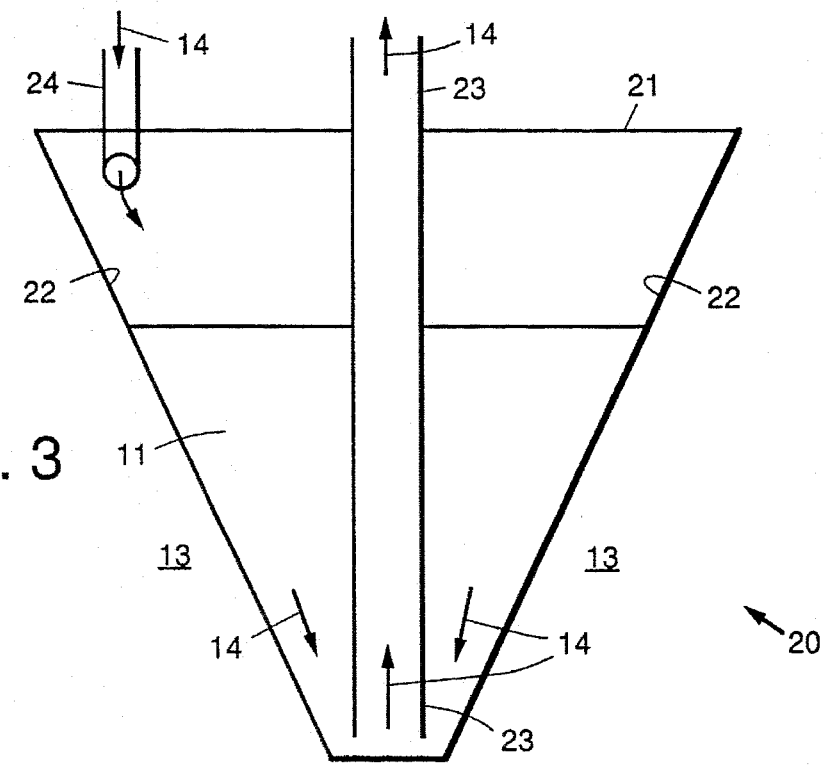

Fig. 3

| PROVIDING A SEALED CONTAINER COMPRISING A SLANTED SIDE WALL HAVING AN INVERTED CONE-SHAPED CROSS SECTION | 31 |

↓

| DISPOSING SOLID METAL ORGANIC SOURCE MATERIAL IN THE SEALED CONTAINER | 32 |

↓

| HEATING THE SEALED CONTAINER | 33 |

↓

| INJECTING A CARRYING GAS INTO THE SEALED CONTAINER ADJACENT THE TOP THEREOF SO THAT CARRYING GAS IS INJECTED IN A TANGENTIAL DIRECTION RELATIVE TO THE SOLID SOURCE MATERIAL | 34 |

↓

| REMOVING SATURATED CARRYING GAS FROM A GAS OUTLET DISPOSED ADJACENT THE BOTTOM OF THE SEALED CONTAINER | 35 |

Fig. 4

BUBBLER FOR SOLID METAL ORGANIC SOURCE MATERIAL AND METHOD OF PRODUCING SATURATED CARRYING GAS

BACKGROUND OF THE INVENTION

The present invention generally relates to bubblers, and more particularly, to an improved bubbler for use with solid metal organic source material.

Cylindrical shaped bubblers are commonly used for metal organic source material in both liquid and solid form. Channels tend to form in bubblers containing a solid source operating under high carrying gas flow conditions. Once channels are formed, the carrying gas passes through the bubbler without getting saturated with the vapor of the metal organic source material corresponding to the bath temperature of the bubbler. The channeling effect leads to reduction in metal organic precursor flux at a given carrying gas flow rate, upsetting the delicate balance of precursor flux ratio required of MOCVD compound semiconductor epitaxial growth process. The net result is epitaxial growth rate reduction, uncertainty in film thickness, degradation of key material characteristics and poor epitaxial layer surface morphology.

Therefore, it is an objective of the present invention to provide for an improved bubbler for use with solid metal organic source material used in metal organic chemical vapor phase deposition (MOCVD) systems. It is also an objective of the present invention to provide for a method of producing carrying gas saturated with source material that is injected into such MOCVD systems.

SUMMARY OF THE INVENTION

In order to meet the above and other objectives, the present invention provides for an improved bubbler (container) for use with solid metal organic source material (precursor material) in a production metal organic chemical vapor phase deposition (MOCVD) system. The bubbler comprises a sealed container having a slanted wall with an inverted cone-shaped cross section. Solid metal organic source material is disposed in the container. A heat bath surrounds the sealed container. A carrying gas inlet is disposed adjacent the top of the inverted cone-shaped container. Carrying gas is injected in a tangential direction relative to the solid precursor material, and a whirlpool effect is generated by the tangential gas flow that imparts a centrifugal force to gas molecules thereof, pushing the precursor material against the wall of the bubbler to promote heat flow from the heat bath to sustain high rate sublimation. A gas outlet is disposed adjacent the bottom of the inverted cone-shaped container. Once precursor material lining the slanted inner wall is removed, gravitational forces cause precursor material to refill the empty space, reducing channel formation and preventing thermal isolation of the precursor material at the center of the bubbler.

The bubbler has a large side wall surface to volume ratio, a slanted inner side wall in the shape of an inverted cone. Incoming carrying gas flows tangentially near the top of the container. The configuration of the bubbler serves to alleviate the well-known channeling effect which is caused by high carrying gas flow rate needed for high capacity (high growth rate multi-wafer) epitaxial device material preparation. The sand like solid metal organic source material, pulled by gravitational force, always makes intimate contact with the inner side wall of the bubbler, alleviating channel formation. The improved bubbler leads to a stable precursor material flux carried from the solid metal organic reservoir to the epitaxial reactor chamber, resulting in reproducible growth rate and epitaxial material properties.

The present invention also provides for a method of producing a carrying gas saturated with source material that is injected into an epitaxial reactor. The method comprises the following steps. The first step is to provide a sealed container comprising a slanted wall having an inverted cone-shaped cross section. The next step is to dispose solid metal organic source material in the sealed container. The next step is to heat the sealed container. The next step is to inject a carrying gas adjacent the top of the inverted cone-shaped container so that carrying gas is injected in a tangential direction relative to the solid precursor material, and wherein a whirlpool effect is generated by the tangential gas flow that imparts a centrifugal force to gas molecules thereof, pushing the precursor material against the wall of the bubbler to promote heat flow from the heat bath to sustain high rate sublimation. The next step is to remove saturated carrying gas from a gas outlet disposed adjacent the bottom of the inverted cone-shaped container. As a result, gravitational forces cause precursor material to refill empty spaces, thus reducing channel formation and preventing thermal isolation of the precursor material at the center of the bubbler.

The present invention has immediately benefits for magnetoresistance (MR) sensor manufacturing processes, such as those used to produce automotive ignition timing control circuits, power steering control circuits, brushless windshield wiper motors, and braking and suspension systems, and the like.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIG. 3 illustrates a cone-shaped bubbler in accordance with the principles of the present invention that eliminates the channel effect of conventional bubblers; and FIG. 4 is a flow diagram illustrating one method in accordance with the principles of the present invention.

DESCRIPTION OF THE PREFERRED EMBODIMENTS

Figure 1:
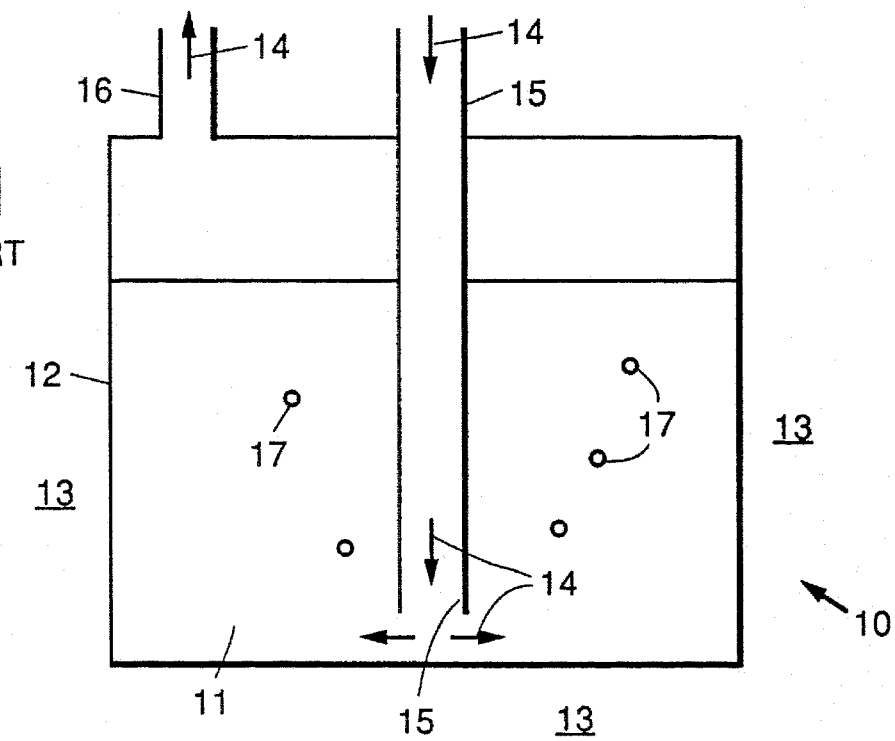
FIG. 1 illustrates a conventional cylindrical shaped bubbler used to process MOCVD liquid precursor source material.

Referring to the drawing figures, FIG. 1 illustrates a conventional cylindrical shaped bubbler 10 used to process MOCVD liquid precursor source material 11. Metal organic source (precursor) materials 11 are the primary ingredients of a metal organic chemical vapor phase deposition (MOCVD) process for electronic device material preparation. The precursor materials 11, depending on the species, comprise a gaseous (arsine), liquid (trimethyl gallium), or solid (trimethyl indium) form. Mass flow controllers are commonly used to provide precision control of the flux of each source material 11 injected into the epitaxial reactor. The flow rate of a gaseous precursor material 11 is directly measured.

A liquid precursor material 11 is placed inside a cylindrical container 12, which is in turn immersed in a constant temperature bath 13. A stream of carrying gas 14 such as hydrogen, for example, is introduced from the bottom of the container 12 at an inlet 15, picking up the vapor of the precursor material 11 as bubbles 17 of the carrying gas 14 rise through the liquid precursor material 11. This type of vapor transport has led to the name "bubbler" for the source material container 12. The carrying gas 14 is saturated with the precursor material 11 at a partial vapor pressure corresponding to the ambient temperature (bath temperature) if there is enough path length and contact time. The same type of cylindrical container 12 or bubbler 10 is used for a solid precursor such as trimethyl indium (TMIn) for MOCVD indium antimonide growth. The hydrogen carrying gas 14 picks up the precursor vapor as it diffuses through sand-like TMIn precursor material 11. This type of vapor-transport is satisfactory as long as the path length is long and the flow rate of the carrying gas 14 is low enough so that the gas stream is saturated by the precursor vapor at an outlet 16 of the bubbler 10.

Figure 2:
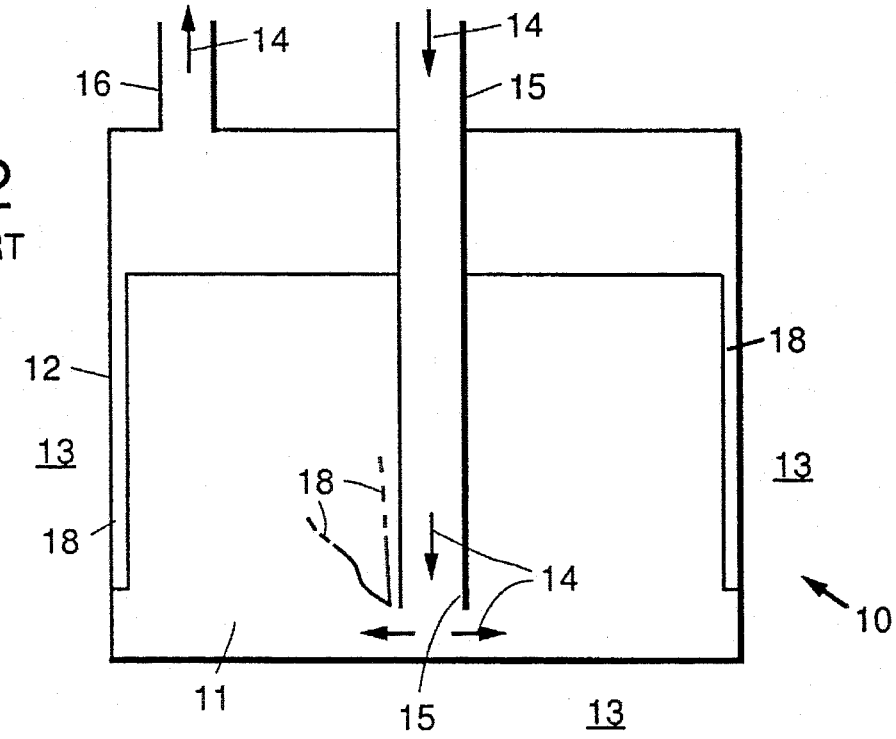
FIG. 2 illustrates a channel effect in the conventional bubbler of FIG. 1.

A high carrying gas flow rate is required for high-capacity MOCVD production reactors capable of handling multiple large area wafers at high growth rates. The higher gas flow rate often causes channels 18 to form inside solid precursor material 11, which is a sand-like material. FIG. 2 illustrates a channel effect in the conventional bubbler 10 of FIG. 1. A large portion of the carrying gas 14 then flows through these low resistance paths or channels 18 at high speed, unsaturated, bringing lesser amount of the precursor material 11 into the epitaxial reactor chamber. Channels 18 may be formed along the outside wall of the container 12, along the edge of the inlet 15 or anywhere within the precursor material 11, as indicated by the wavy lines in FIG. 2. The unintentional change in precursor flux leads to unanticipated growth rate fluctuation; and in the worst case, an improper precursor flux ratio can result in a failed epitaxial run as in the case of indium antimonide deposition.

The mechanism for the channeling effect has not been well understood in the past. Attempts made by suppliers of MOCVD precursor material 11 to improve packaging schemes for solid sources (i.e. mixing quartz beads with trimethyl indium in a bubbler) have been ineffective. The bubbler 20 (FIG. 3) of the present invention has been designed based on the fact that it takes heat to sustain a sublimation-direct transition from the solid state to the gaseous state. At a given temperature, the vapor pressure of a solid is the partial pressure of that material at the interface, that is, there are as many molecules condensing on the solid surface as the number of molecules sublimating from the surface at a given time period. Equilibrium is destroyed if the molecules in gaseous state is removed from the solid/gas interface by the carrying gas 14. Sublimation takes place at a higher rate to restore equilibrium if there is enough heat supplied to the surface of the solid to make up for the latent heat of sublimation.

For solid metal organic precursor material 11 in the conventional cylindrical bubbler 10, the only heat from the constant temperature bath 13 must come through the side wall. Material lining the side wall sublimates at higher rate because it has better access of heat. Once the material near the side wall is removed, the material at the core (FIG. 2) is nearly thermally insulated from the heat source, namely the constant temperature bath 13. Temperature at the core drops to maintain thermodynamic balance reducing the rate of sublimation according to the availability of heat to make up for the latent heat that is required. As a result, higher carrier gas flow can lead to lower temperature, lower sublimation rate, reduced availability of precursor flux as well as undesirable low resistance paths or channels.

The channeling effect is alleviated using the bubbler 20 in accordance with the principles of the present invention, a cross section of which is illustrated in FIG. 3. The bubbler 20 comprises a chamber 21 or container 21 having a slanted side wall 22, having an inverted cone shape, as is illustrated in FIG. 3. When precursor material 11 lining the inner side wall 22 is removed, gravitational forces cause the sand-like precursor material 11 to refill the empty space, reducing the channel formation and preventing thermal isolation of the precursor material at the center of the bubbler 20.

A gas outlet 23 is connected to the bottom of the inverted cone-shaped chamber 21. The cone-shaped bubbler 20 provides a greater wall-surface to volume ratio, reducing the probability of thermal isolation for precursor material 11 located near the axis of the container 21 near the gas outlet 23. The surface to volume ratio of a cone is about 1.5 times that of a comparably sized cylinder. The cone-shaped container 21 is three times as tall as a cylindrical container 12 of identical capacity if the diameter of the two containers is the same. The carrying gas 14, which has a longer path length in the chamber 23 of the bubbler 20, has a better chance to be saturated with the vapor pressure of the precursor material corresponding to the temperature of the bath 13.

A carrying gas inlet 24 is located near the top of the inverted cone shaped container 23. The carrying gas 14 is injected in a tangential direction relative to the side wall 22. Both the tangential gas injection and the reverse carrying gas flow direction (relative to the conventional bubbler 10) reduces the probability of creating channels in the sand-like solid precursor material 11 (a high gas velocity near the inlet 24 has a higher probability of initiating channeling). In addition, a whirlpool effect generated by the tangential gas injection direction provides gas molecules with a centrifugal force, pushing the precursor material 11 against the side wall 22 of the bubbler 20 and promoting heat flow from the bath 13, which is a critical factor in sustaining high rate sublimation. The cone-shaped configuration of the bubbler 20 allows fresh carrying gas 14 to have more time (slower vertical flow velocity) to pick up precursor vapor near the inlet 24. The higher gas flow velocity near the outlet 23 is of no consequence to the operation of the bubbler 20 because the carrying gas 14 is already saturated.

The bubbler 20 is made as tall as possible to allow maximum contact between the carrying gas 14 and the solid precursor material 11, and at the same time increase the surface to volume ratio to facilitate heat transfer between the precursor material 11 and the bath 13. In practice, the base angle of the cone-shaped container 21 should be approximately ten to forty-five degrees.

The present invention thus provides for a bubbler 20 for solid metal organic precursor material 11 in MOCVD reactors. The bubbler 20 alleviates the channeling effect caused by high carrying gas flow rate commonly required for high capacity production epitaxial reactors. As a result, higher epitaxial growth rate, shorter cycle time may be realized without compromising on epitaxial compound semiconductor material quality, which depends critically on the ratio of the flux of each of the precursor species (i.e. the ratio of trimethyl indium flux and trimethyl antimony flux is critical to the surface morphology of epitaxial indium antimony material).

The present bubbler 20 may be used in the manufacture magnetoresistance sensors, for example, such as those used to produce automotive ignition timing control circuits, power steering control circuits, brushless windshield wiper motors, and braking and suspension systems, and the like.

The present invention also provides for a method 30 of producing a carrying gas saturated with source material that is injected into an epitaxial reactor. Referring to FIG. 4, it is a flow diagram illustrating a method 30 in accordance with the present invention. The method first comprises providing 31 a sealed container comprising a slanted wall having an inverted cone-shaped cross section. The next step is to dispose 32 solid metal organic source material in the sealed container. The next step is to heat 33 the sealed container. The next step is to inject 34 a carrying gas adjacent the top of the inverted cone-shaped container so that carrying gas is injected in a tangential direction relative to the solid precursor material, and wherein a whirlpool effect is generated by the tangential gas flow that imparts a centrifugal force to gas molecules thereof, pushing the precursor material against the wall of the bubbler (20) to promote heat flow from the heat bath to sustain high rate sublimation. The next step is to remove 35 saturated carrying gas from a gas outlet disposed adjacent the bottom of the inverted cone-shaped container. As a result, gravitational forces cause precursor material to refill empty spaces, thus reducing channel formation and preventing thermal isolation of the precursor material at the center of the bubbler 20.

Thus a bubbler for use with solid metal organic source material used in metal organic chemical vapor phase deposition systems, and a method of producing saturated carrying gas that is injected into such systems have been described. It is to be understood that the above-described embodiment is merely illustrative of some of the many specific embodiments which represent applications of the principles of the present invention. Clearly, numerous and other arrangements can be readily devised by those skilled in the art without departing from the scope of the invention.

What is claimed is:

1. A bubbler for use in a metal organic chemical vapor phase deposition system, said bubbler comprising:

a sealed container comprising a slanted wall having an inverted cone-shaped cross section;

solid metal organic source material disposed in the sealed container;

a heat bath surrounding the sealed container;

a carrying gas inlet disposed adjacent the top of the inverted cone-shaped container disposed so that carrying gas is injected in a tangential direction relative to the solid source material, and wherein a whirlpool effect is generated by the tangential gas flow that imparts a centrifugal force to gas molecules thereof, pushing the source material against the wall of the bubbler to promote heat flow from the heat bath to sustain high rate sublimation; and a gas outlet disposed adjacent the bottom of the inverted cone-shaped container;

whereby once source material lining the slanted wall is removed, gravitational forces cause the source material to refill empty spaces, reducing channel formation and preventing thermal isolation of the source material at the center of the bubbler.

2. The bubbler of claim 1 wherein the inverted cone-shaped container has a base angle of from approximately ten to forty-five degrees.

3. The bubbler of claim 1 wherein the solid source material comprises trimethyl indium.

4. The bubbler of claim 1 wherein the carrying gas comprises hydrogen.

5. A method of producing a carrying gas saturated with source material that is injected into an epitaxial reactor, said method comprising the steps of:

providing a sealed container comprising a slanted side wall having an inverted cone-shaped cross section;

disposing solid metal organic source material in the sealed container;

heating the sealed container;

injecting a carrying gas into the inverted cone-shaped container adjacent the top thereof so that carrying gas is injected in a tangential direction relative to the solid source material, and wherein a whirlpool effect is generated by the tangential gas flow that imparts a centrifugal force to gas molecules thereof, pushing the source material against the wall of the bubbler to promote heat flow from the heat bath to sustain high rate sublimation; and removing saturated carrying gas from a gas outlet disposed adjacent the bottom of the inverted cone-shaped container;

whereby gravitational forces cause source material to refill empty spaces, thus reducing channel formation and preventing thermal isolation of the source material at the center of the bubbler.

6. The method of claim 5 wherein the step of providing a sealed container comprises the step of providing a sealed container having a base angle of from approximately ten to forty-five degrees.

7. The method of claim 5 wherein the step of disposing solid metal organic source material in the sealed container comprises the step of disposing trimethyl indium in the sealed container.

8. The method of claim 5 wherein the step of injecting a carrying gas into the inverted cone-shaped container comprises the step of injecting hydrogen into the container.

\* \* \* \* \*